United States Patent [19]

Bour et al.

[11] Patent Number: 5,745,517
[45] Date of Patent: Apr. 28, 1998

[54] ALTERNATIVE DOPING FOR ALGAINP LASER DIODES FABRICATED BY IMPURITY-INDUCED LAYER DISORDERING (IILD)

[75] Inventors: David P. Bour, Cupertino; Robert L. Thornton, Los Altos, both of Calif.; Kevin J. Beernink, Urbana, Ill.

[73] Assignee: Xerox Corporation, Stamford, Conn.

[21] Appl. No.: 581,691

[22] Filed: Dec. 29, 1995

[51] Int. Cl.⁶ ............................. H01S 3/19; H01L 29/167
[52] U.S. Cl. .................... 372/47; 257/88; 257/607; 372/45; 372/46
[58] Field of Search ..................... 372/47, 46, 45; 257/88, 607, 613

[56] References Cited

U.S. PATENT DOCUMENTS

| | | | |
|---|---|---|---|
| 5,062,115 | 10/1991 | Thornton | 372/50 |
| 5,073,895 | 12/1991 | Omura | 372/47 |
| 5,138,624 | 8/1992 | Hong et al. | 372/47 |
| 5,164,797 | 11/1992 | Thornton | 372/47 |
| 5,216,263 | 6/1993 | Paoli | 372/50 |
| 5,317,586 | 5/1994 | Thornton et al. | 372/45 |
| 5,574,745 | 11/1996 | Paoli et al. | 372/50 |

*Primary Examiner*—James W. Davie
*Attorney, Agent, or Firm*—William Propp

[57] ABSTRACT

The polarity of the semiconductor layers in an AlGaInP semiconductor laser fabricated by impurity induced layer disordering (IILD) is reversed to allow n-doping. Thus, the cladding and confinement layers between the substrate and the active layer will have p-type conductivity. The upper confinement, cladding, and contact layers can be either n or p-type conductivity with n-diffused regions formed by IILD extending down from the contact layer to the lower cladding layer. The electrodes can include either a substrate electrode or a lateral electrode.

15 Claims, 3 Drawing Sheets

ALTERNATIVE DOPING FOR ALGAINP LASER DIODES FABRICATED BY IMPURITY-INDUCED LAYER DISORDERING (IILD)

BACKGROUND OF THE INVENTION

This invention relates to AlGaInP laser diodes semiconductor structures fabricated by impurity-induced layer disordering (IILD) and, more particularly, to an alternate doping for AlGaInP lasers fabricated by impurity-induced layer disordering.

During the fabrication of semiconductor laser diodes by silicon impurity-induced layer disordering (IILD), the intermixed material is rendered highly n-type ($n=3 \times 10^{18}$ cm$^{-3}$), since the silicon is a n-donor species. As a result of this intermixed, n-type region penetrating through the p-cladding layer, both confinement layers and the active layer and into the n-cladding layer, injection current would be shunted around the laser stripe. Consequently, an important final process step is included after the IILD, to isolate this shunt path by forming a p-n junction within the high-bandgap material comprising it, thereby restricting the injection current to the laser stripe. Normally, this isolation and restriction is done in an AlGaAs semiconductor laser diode simply by a shallow zinc (p-type) diffusion, where the acceptor concentration is great enough to fully compensate the silicon donors resulting from IILD.

However, P-type doping is more difficult in AlGaInP than in AlGaAs. It is uncertain whether a large enough concentration of electrically active acceptors can be incorporated to compensate the silicon donors and reverse its conductivity from n-type to p-type.

It is an object of the invention is to provide an alternate doping for AlGaInP laser diodes semiconductor structures fabricated by impurity-induced layer disordering (IILD).

It is another object of this invention to provide reversed conductivity types for the semiconductor layers of an AlGaInP laser diodes semiconductor structures with p-type semiconductor cladding and confinement layers between the substrate and the active layer and n-type cladding and confinement layers between the active layer and the cap or contact layer.

It is yet another object of this invention to provide p-conductivity types for all the semiconductor cladding and confinement layers of an AlGaInP laser diodes semiconductor structure.

SUMMARY OF THE INVENTION

The polarity of the semiconductor layers in an AlGaInP semiconductor laser fabricated by impurity induced layer disordering (IILD) is reversed to allow n-doping. Thus, the cladding and confinement layers between the substrate and the active layer will have p-type conductivity. The upper confinement, cladding, and contact layers can be either n or p-type conductivity with n-diffused regions formed by IILD extending down from the contact layer to the lower cladding layer. The electrodes can include either a substrate electrode or a lateral electrode.

Other objects and attainments together with a fuller understanding of the invention will become apparent and appreciated by referring to the following description and claims taken in conjunction with the accompanying drawings.

DESCRIPTION OF THE PREFERRED EMBODIMENT

Aluminum gallium indium phosphide (AlGaInP) is, more precisely, a quaternary alloy of $(Al_xGa_{1-x})_yIn_{1-y}P$. The AlGaInP quaternary alloy encompasses the ternary alloys of AlInP and GaInP.

Figure 1:
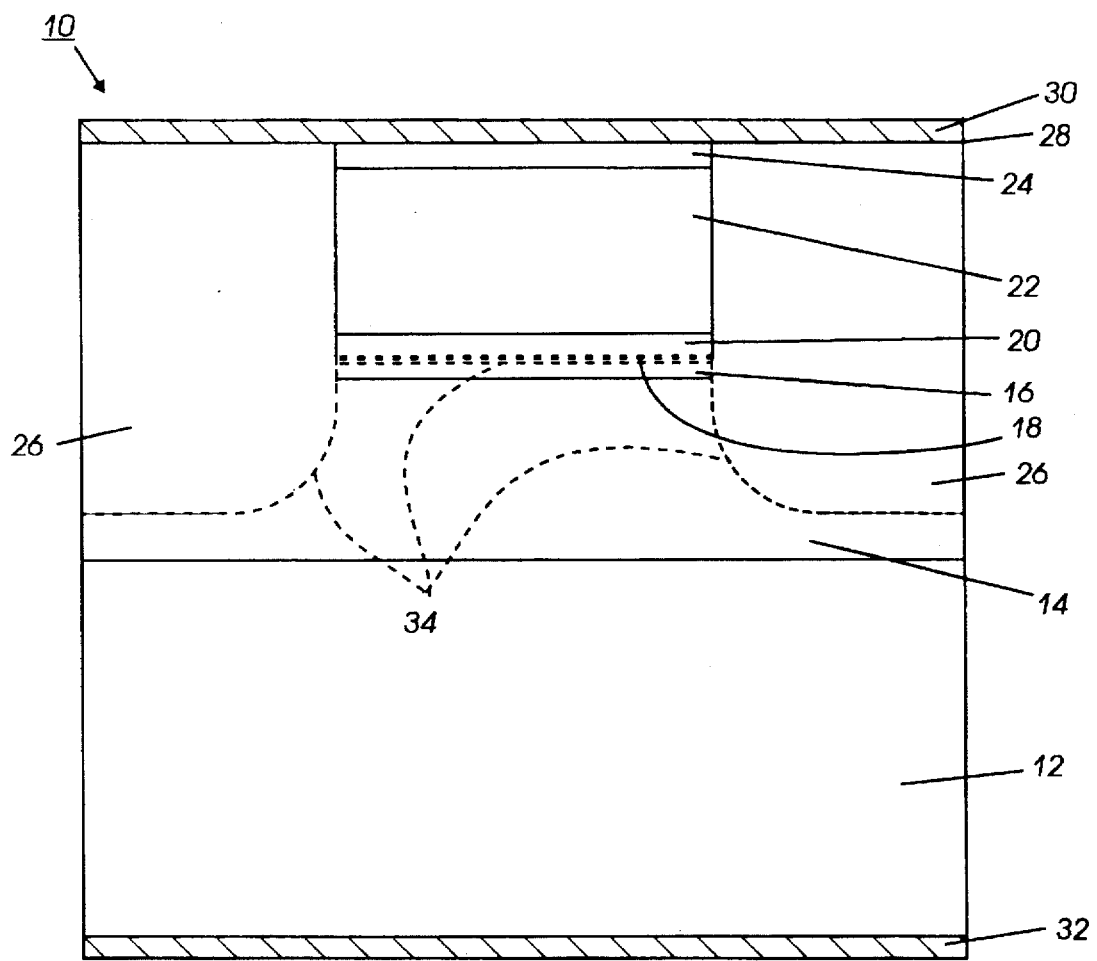
FIG. 1 is a schematic illustration of the cross-section side view of an AlGaInP semiconductor laser structure with a p-type substrate formed according to the present invention.

Reference is now made to FIG. 1 wherein there is described the AlGaInP semiconductor laser structure 10 grown on a p-type substrate 12 of the present invention. The semiconductor laser structure 10 has a p-GaAs substrate 12. The p-type conductivity type can be fabricated by doping the GaAs with a p-type dopant such as Zn. Other possible p-dopants would include Mg. Upon the p-GaAs substrate is epitaxially deposited, in a known manner, a succession of semiconductor layers comprising, in order, a lower p-AlGaInP cladding layer 14, a lower p-AlGaInP optical and carrier confinement layer 16, an GaInP active quantum well layer 18, an upper n-AlGaInP optical and carrier confinement layer 20, an upper n-AlGaInP cladding layer 22, and a n-GaInP cap or contact layer 24. The laser structure 10 can be fabricated by a technique such as metalorganic chemical vapor deposition (MOCVD) as is well known in the art. The semiconductor layers of the AlGaInP semiconductor laser structure 10 will be of the conventional thicknesses.

Typically, the conductivity types of the semiconductor layer below the active layer are n-type conductivity and the conductivity types above the active layer are p-type conductivity. However, in the semiconductor laser structure 10 of the present invention, the conductivity types of the semiconductor layer below the active layer are p-type conductivity and the conductivity types above the active layer are n-type conductivity. The conductivity of each layer can be fabricated by doping, usually with Zn for p-type conductivity and with Si for n-type conductivity.

N-diffused regions 26 are formed by impurity-induced layer disordering (IILD) by masking sections of the top surface 28 of the n-cap layer 24 and selectively diffusing a high concentration n-impurity dopant, such as silicon, under heat through the upper layers of the monolithic laser structure 10 down partially into the lower p-AlGaInP cladding layer 14. The N-diffused impurity induced disordered regions 26 are provided to electrically and optically isolate the laser structure by current confinement and optical confinement of the emitted beam. Other possible n-dopants would include Ge and Sn. Techniques for impurity-induced layer disordering (IILD) are taught in U.S. Pat. Nos. 5,062,115 and 5,216,263, both commonly assigned as the present application and both herein incorporated by reference.

A n-ohmic metal electrode 30 is formed on the contact layer 24. A p-ohmic metal electrode 32 is formed on the substrate 12. Not shown are the usual reflecting facets forming the optical cavity with and perpendicular to the quantum well active layer 18 at opposite ends of the laser structure 10.

The AlGaInP laser structure 10 of FIG. 1 is grown on a p-type substrate 12 (opposite the normal polarity), so that the upper cladding layer 22 is n-type. Subsequent to silicon IILD, no further impurity diffusion is required, unlike the prior art AlGaAs semiconductor laser structures. The n-metal contact 30 is deposited over the surface 28 of the contact layer 24 and the p-metal contact 32 is deposited on the substrate 12. The lowest-bandgap P-N junction 34 (the dashed curve in FIG. 1) occurs at the quantum well active layer 18. Therefore, carriers are preferentially injected into the quantum well active layer under forward bias, so that an efficient, low-threshold current laser could be constructed in this manner. As in the case for AlGaAs semiconductor laser structures, closely-spaced arrays of independently addressable lasers could be fabricated.

P-type substrates are not generally of as high a quality as n-type substrates, which are normally used for preparation of laser diodes. P-type substrates typically contain a larger density of dislocations. The best p-GaAs wafers have etch pit densities of about 2000 $cm^{-2}$ while the usual Si-doped n-GaAs wafers have etch pit densities under 300 $cm^{-2}$.

Figure 2:
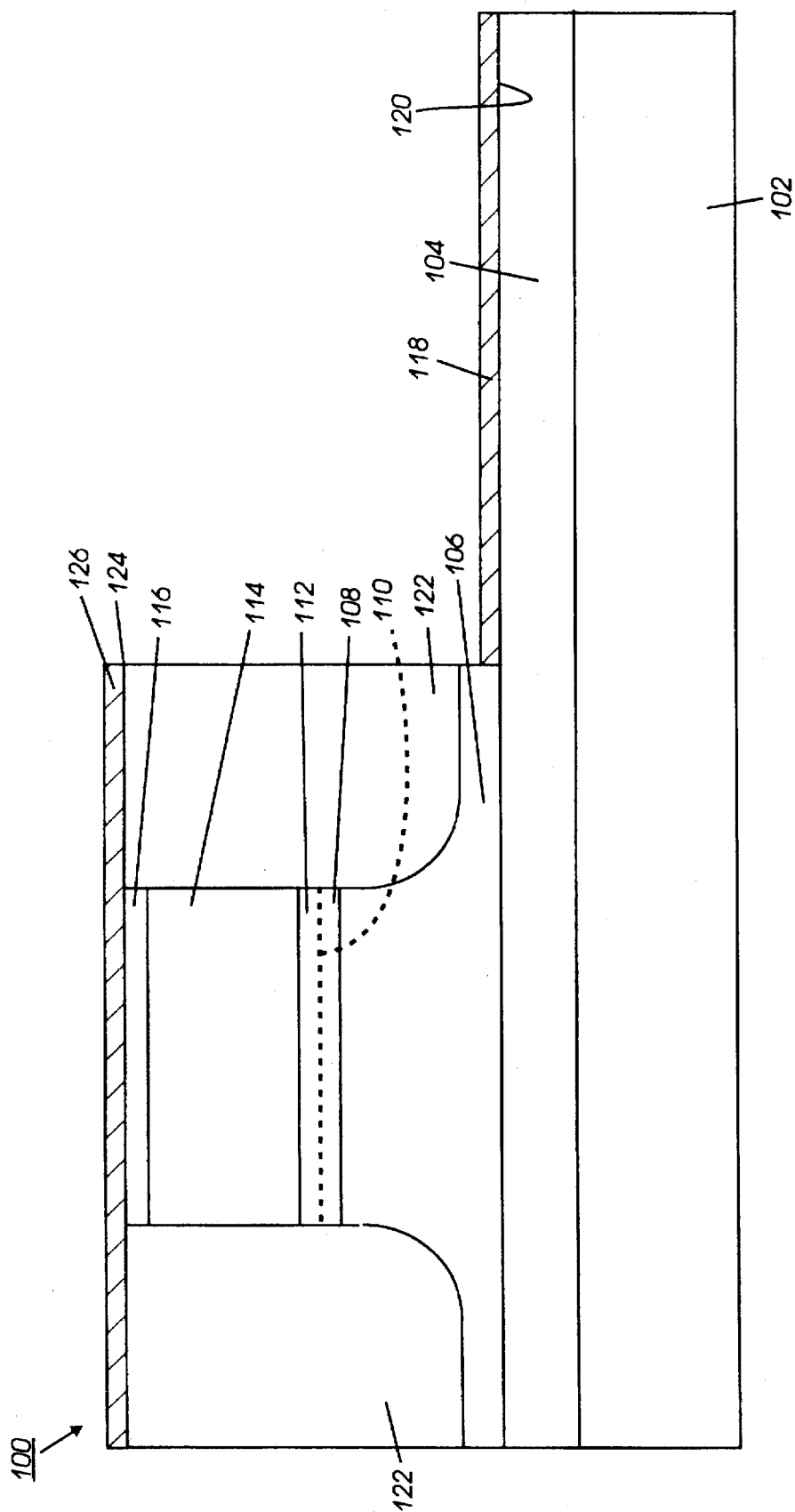
FIG. 2 is a schematic illustration of the cross-section side view of an alternative embodiment of an AlGaInP semiconductor laser structure with a n-type or insulating substrate formed according to the present invention.

Furthermore, the p-dopant species for p-substrates is usually zinc, which can out-diffuse at the elevated temperatures required for IILD. Therefore, it is desirable to grow the AlGaInP laser structure on an n-type (or insulating) substrate, as shown in FIG. 2. In this case, a lateral contact to the p-cladding layer could be used instead of the p-contact of the substrate of FIG. 1.

Reference is now made to FIG. 2 wherein is described an alternative AlGaInP semiconductor laser structure 100 grown on a n-type or insulating substrate 102 of the present invention. The semiconductor laser structure 100 has a n-type or insulating GaAs substrate 102. The n-type conductivity type can be fabricated by doping the GaAs with a n-type dopant such as Si. The insulating GaAs substrate can be formed by not doping the GaAs.

Upon the p-GaAs substrate is epitaxially deposited, in a known manner, a succession of semiconductor layers comprising, in order, a p-GaAs lateral contact layer 104 (sometimes referred to as a buffer layer), a lower p-AlGaInP cladding layer 106, a lower p-AlGaInP optical and carrier confinement layer 108, an GaInP active quantum well layer 110, an upper n-AlGaInP optical and carrier confinement layer 112, an upper n-AlGaInP cladding layer 114, and a n-GaInP cap or contact layer 116. The laser structure 100 can be fabricated by a technique such as metalorganic chemical vapor deposition (MOCVD) as is well known in the art. The semiconductor layers of the AlGaInP semiconductor laser structure 100 will be of the conventional thicknesses.

Typically, the conductivity types of the semiconductor layer below the active layer are n-type conductivity and the conductivity types above the active layer are p-type conductivity. However, in line with the present invention, in the semiconductor laser structure 100, the conductivity types of the semiconductor layer below the active layer are p-type conductivity (except for the n-type or insulating substrate 102) and the conductivity types above the active layer are n-type conductivity.

The contact layer 116, the upper n-cladding layer 114, the upper n-confinement layer 112, the active quantum well layer 110, the lower p-confinement layer 108 and the p-cladding layer 106 are etched away down to the p-lateral contact layer 104 in a portion of the semiconductor laser structure 100 so that the p-ohmic contact metal electrode 118 can be formed on the etching exposed portion 120 of the p-lateral contact layer 104. The etching of the semiconductor structure 100 can be done by conventional etching techniques, such as chemical etching and ion etching.

N-diffused regions 122 are formed by impurity-induced layer disordering (IILD) by masking sections of the top surface 124 of the n-cap layer 116 and selectively diffusing a high concentration n-impurity dopant, such as silicon, under heat through the upper layers of the monolithic laser structure 100 down partially into the lower p-AlGaInP cladding layer 106. The N-diffused impurity induced disordered regions 122 are provided to electrically and optically isolate the laser structure by current confinement and optical confinement of the emitted beam.

A n-ohmic metal electrode 126 is formed on the contact layer 116. Not shown are the usual reflecting facets forming the optical cavity with and perpendicular to the quantum well active layer 18 at opposite ends of the laser structure 10.

Figure 3:
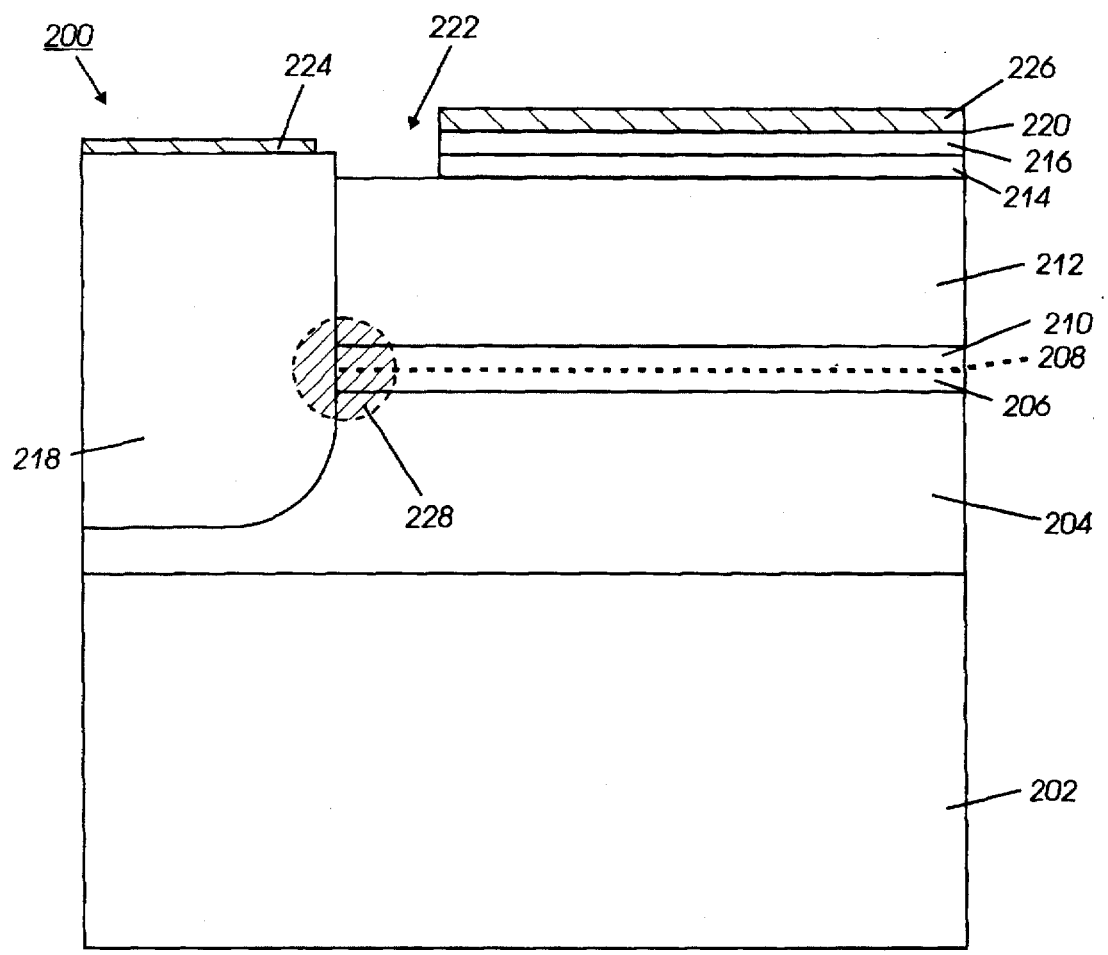
FIG. 3 is a schematic illustration of the cross-section side view of an AlGaInP transverse junction stripe laser structure with an all p-type semiconductor layer structure formed according to the present invention.

All the epitaxial semiconductor layers of the laser structure can be grown p-type and a transverse junction stripe (TJS) laser structure is formed by the type-conversion associated with silicon IILD in the alternative structure of FIG. 3. Both n- and p-type contacts are therefore on the top surface, with a shallow groove between the contact pads (etched through the contact/capping layers) for electrical isolation. Under forward bias, carriers are injected into the quantum well active layer because this is where the bandgap energy is lowest along the P-N junction.

Reference is now made to FIG. 3 wherein there is described an AlGaInP transverse junction stripe laser structure 200 of the present invention. The semiconductor laser structure 200 has a GaAs substrate 202, which can be either p-type or n-type or insulating. The p-type conductivity type can be fabricated by doping the GaAs with a p-type dopant such as Zn. The n-type conductivity type can be fabricated by doping the GaAs with a n-type dopant such as Si. The insulating GaAs substrate can be formed by not doping the GaAs.

Upon the p-GaAs substrate is epitaxially deposited, in a known manner, a succession of semiconductor layers comprising, in order, a lower p-AlGaInP cladding layer 204, a lower p-AlGaInP optical and carrier confinement layer 206, an GaInP active quantum well layer 208, an upper p-AlGaInP optical and carrier confinement layer 210, an upper p-AlGaInP cladding layer 212, a p-GaInP barrier reduction layer 214 and a p-GaAs cap or contact layer 216.

Typically, the conductivity types of the semiconductor layer below the active layer are n-type conductivity and the conductivity types above the active layer are p-type conductivity. However, in line with the present invention, in the semiconductor laser structure 200, the conductivity types of the semiconductor layer of all the semiconductor layers, above and below the active layer, are p-type (except for the substrate 202 which can be p-type but could also be n-type or insulating).

An n-diffused region 218 is formed by impurity-induced layer disordering (IILD) by masking sections of the top surface 220 of the cap or contact layer 216 and selectively diffusing a high concentration n-impurity dopant, such as silicon, under heat through the upper layers of the monolithic laser structure 20 down partially into the lower p-cladding layer 204. The N-diffused impurity induced disordered region 218 is provided to electrically and optically isolate the laser structure by current confinement and optical confinement of the emitted beam.

The p-GaAs cap or contact layer 216 and the p-GaInP barrier reduction layer 214 are etched away adjacent to the n-diffused region 218 to form a groove 222 between the n-diffused regions 218 and the remaining undiffused, non-impurity-induced layer disordered cap or contact layer 216 and barrier reduction layer 214. The groove is for electrical isolation. The etching of the semiconductor structure 200 can be done by conventional etching techniques, such as chemical etching and ion etching.

An n-ohmic metal electrode 224 is formed on the n-diffused impurity induced disordered region 218.

A p-ohmic metal electrode 226 is formed on the contact layer 216. Not shown are the usual reflecting facets forming the optical cavity with and perpendicular to the quantum well active layer 208 at opposite ends of the laser structure 200.

The laser structure 200 can be fabricated by a technique such as metalorganic chemical vapor deposition (MOCVD) as is well known in the art. The semiconductor layers of the AlGaInP semiconductor laser structure 200 will be of the conventional thicknesses.

The laser emitting area or laser spot 228 is at the transverse junction between the quantum well active layer 208 and the n-diffused impurity induced disordered region 218.

More symmetric lateral index guiding could be achieved in such a structure by having intermixed regions surrounding the laser emitting area. This could be accomplished by performing IILD on both sides of the laser emitting area, instead of on only one side, for example as is done for surface skimming lasers (R. L. Thornton et al., App. Phys Letts. 59, 513 [1991]). In this case, the p-contact becomes more difficult, but could be done using the p-substrate of FIG. 1 or the lateral p-contact of FIG. 2. There are alternate conventional techniques and diffusion/implant species for carrying out the desired disordering, layer intermixing or the elemental implant/annealing technique. Discussion herein was confined to impurity induced disordering or layer intermixing as taught in U.S. Pat. No. 5,062,115, commonly assigned as the present application and herein incorporated by reference. However, it should be noted that these other techniques and elemental diffusions or implants are equally applicable.

Semiconductor layers of AlGaInP encompass all variations of the quaternary alloy of $(Al_xGa_{1-x})_yIn_{1-y}P$, including the ternary alloys of AlInP and GaInP. Thus, for example, the cladding layers of the semiconductor lasers could be AlInP. The cap or contact layers could, like the substrate, be GaAs.

While AlGaInP cladding and confinement layers are preferred, other III-V substrate compositions can be substituted. Similarly, other optical and carrier confining materials having comparable lattice constants and bandgaps can be substituted. It will also be evident that all of the conventional epitaxial growth techniques can be used, such as MO-VPE, MBE, and LPE, to manufacture the semiconductor crystalline structures described herein.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims

What is claimed is:

1. An AlGaInP semiconductor laser comprising
    a substrate,
    a first cladding layer of p-type conductivity deposited on said substrate,
    a first confinement layer of p-type conductivity deposited on said cladding layer,
    an active layer deposited on said first confinement layer,
    a second confinement layer deposited on said active layer,
    a second cladding layer deposited on said second confinement layer,
    a contact layer deposited on said second cladding layer,
    n-diffused regions which extend from said contact layer into said first cladding layer, and
    electrodes for passing current through said active layer to thereby cause light emission from said active layer.

2. The AlGaInP semiconductor laser of claim 1 wherein said second confinement layer, said second cladding layer and said contact layer are of n-type conductivity.

3. The AlGaInP semiconductor laser of claim 2 wherein one of said electrodes is on said substrate and another of said electrodes is on said contact layer.

4. The AlGaInP semiconductor laser of claim 1 wherein said substrate is of p-type conductivity.

5. The AlGaInP semiconductor laser of claim 4 wherein one of said electrodes is on said substrate and another of said electrodes is on said contact layer.

6. The AlGaInP semiconductor laser of claim 2 further comprising a lateral contact layer of p-type conductivity deposited on said substrate, said first cladding layer of p-type conductivity deposited on said lateral contact layer.

7. The AlGaInP semiconductor laser of claim 6 wherein one of said electrodes is on said lateral contact layer and another of said electrodes is on said contact layer.

8. The AlGaInP semiconductor laser of claim 6 wherein said substrate is of n-type conductivity or insulating.

9. The AlGaInP semiconductor laser of claim 8 wherein one of said electrodes is on said lateral contact layer and another of said electrodes is on said contact layer.

10. An AlGaInP transverse junction stripe semiconductor laser comprising
    a substrate of either p-type or n-type conductivity or insulating,
    a first cladding layer of p-type conductivity deposited on said substrate,
    a first confinement layer of p-type conductivity deposited on said cladding layer,
    an active layer deposited on said first confinement layer,
    a second confinement layer of p-type conductivity deposited on said active layer,
    a second cladding layer of p-type conductivity deposited on said second confinement layer,
    a barrier reduction layer of p-type conductivity deposited on said second cladding layer,
    a contact layer of p-type conductivity deposited on said barrier reduction layer,
    at least one n-diffused region which extends from said contact layer into said first cladding layer, and
    electrodes for passing current through said active layer to thereby cause light emission from said active layer.

11. The AlGaInP transverse junction stripe semiconductor laser of claim 10 wherein one of said electrodes is on said at least one n-diffused region and another of said electrodes is on said contact layer, said electrodes being electrically isolated from each other.

12. The AlGaInP transverse junction stripe semiconductor laser of claim 10 wherein one of said electrodes is on said substrate and another of said electrodes is on said contact layer.

13. The AlGaInP transverse junction stripe semiconductor laser of claim 10 further comprising a lateral contact layer of p-type conductivity deposited on said substrate, said first cladding layer of p-type conductivity deposited on said lateral contact layer.

14. The AlGaInP transverse junction stripe semiconductor laser of claim 13 wherein one of said electrodes is on said lateral contact layer and another of said electrodes is on said contact layer.

15. In an AlGaInP semiconductor structure, an improvement comprising a plurality of semiconductor layers between a substrate and an active layer being of p-type conductivity, and n-diffused regions fabricated by impurity induced layer disordering extending into said plurality of semiconductor layers.

* * * * *

UNITED STATES PATENT AND TRADEMARK OFFICE
CERTIFICATE OF CORRECTION

PATENT NO. : 5,745,517 Page 1 of 1
DATED : April 28, 1998
INVENTOR(S) : David P Bour et al.

It is certified that error appears in the above-identified patent and that said Letters Patent is hereby corrected as shown below:

<u>Column 1,</u>
Line 5, insert as a new paragraph:
-- This invention was made with Government support under Agreement No. 70NANB2H1241 awarded by the Department of Commerce. The Government has certain rights in this invention. --.

Signed and Sealed this

Thirteenth Day of June, 2006

JON W. DUDAS
*Director of the United States Patent and Trademark Office*